United States Patent [19]
DelPrete et al.

[11] Patent Number: 5,429,511
[45] Date of Patent: * Jul. 4, 1995

[54] STACKABLE INTERCONNECTION SOCKET

[75] Inventors: Stephen D. DelPrete; Donald Santos, both of Rehoboth, Mass.; Kerry D. Arnold, Clarksville, Ark.; Thomas D. Selgas, Garland; Sean Crowley, Plano, both of Tex.

[73] Assignees: Augat Inc., Mansfield, Mass.; Cyrix Corporation, Richardson, Tex.

[ * ] Notice: The portion of the term of this patent subsequent to Jun. 7, 2011 has been disclaimed.

[21] Appl. No.: 241,510

[22] Filed: May 12, 1994

Related U.S. Application Data

[63] Continuation of Ser. No. 8,208, Jan. 25, 1993, Pat. No. 5,318,451.

[51] Int. Cl.$^6$ ............................................. H01R 13/72
[52] U.S. Cl. .............................................................. 439/69
[58] Field of Search .................................... 439/63–73, 439/525, 526, 331

[56] References Cited

U.S. PATENT DOCUMENTS

| | | | |
|---|---|---|---|
| 4,364,620 | 12/1982 | Mulholland et al. | 339/17 CF |
| 4,406,508 | 9/1983 | Sadigh-Behzadi | 339/75 M |
| 4,696,525 | 9/1987 | Coller et al. | 439/69 |
| 5,075,516 | 12/1991 | Brouillette | 200/5 R |
| 5,151,039 | 9/1992 | Murphy | 439/70 |
| 5,156,649 | 10/1992 | Compton et al. | 439/68 |
| 5,166,609 | 11/1992 | Cole et al. | 324/158 F |

*Primary Examiner*—Neil Abrams
*Attorney, Agent, or Firm*—Weingarten, Schurgin, Gagnebin & Hayes

[57] ABSTRACT

A component carrier and mating system is disclosed for aligning and mating closely spaced leads of integrated circuit (IC) packages, which protects the integrated circuit packages and permits easy installation. The system is particularly adapted for aligning and mating integrated circuits which have high pin counts. A carrier assembly aligns for mating and interconnecting at least two integrated circuit packages having a plurality of leads extending from the packages. A protective shroud covers the stacked packages to maintain the packages in electrical and mechanical engagement and to assure that no damage occurs to the integrated circuit packages. In one embodiment, a first package is installed on the carrier assembly and coupled with the protective shroud to form a pre-engagement assembly, the pre-engagement assembly is then engaged with a second package mounted on a printed circuit board. An extraction tool facilitates disengagement of the assembly from the second package mounted on the printed circuit board.

8 Claims, 15 Drawing Sheets

STACKABLE INTERCONNECTION SOCKET

This application is a continuation of application Ser. No. 08/008,208, filed Jan. 25, 1993, now U.S. Pat. No. 5,318,451.

FIELD OF THE INVENTION

This invention relates to electronic component carriers and sockets, and in particular to an electronic component carrier for interconnecting at least two integrated circuit packages and aligning and mating corresponding package leads.

BACKGROUND OF THE INVENTION

There are many situations where it is desirable to interconnect corresponding leads of integrated circuit (IC) packages in a manner which optimizes use of printed circuit board (PCB) space. These situations include increasing the memory capabilities of a computer system, increasing performance by combining, for example, a microprocessor and a math co-processor, or upgrading a system by disabling the older microprocessor on the PCB and running a newer and faster microprocessor.

Integrated circuit packages come in leadless or leaded configurations. A leadless IC package contains no leads but rather, contains conductive pads on the edges of the package for interconnection to a PCB. Leaded packages, on the other hand, have leads which project outwardly from the body of the package.

Leaded IC packages can be formed in various configurations. A typical configuration is the dual in-line package (DIP). The DIP comprises an IC interconnected to a lead frame, enclosed within a dielectric body with leads partially enclosed within the body. The IC package body generally includes a top and a bottom surface, sidewalls and endwalls. The DIP leads typically extend outwardly from the sidewalls and bend downwardly. The leads are placed in opposed parallel rows and typically range from 4–80 leads per package.

Increases in IC complexity have placed more functionality on a chip than a DIP and its relatively low number of leads can accommodate. Pin grid arrays (PGA) with over 200 leads extending directly from the bottom surface of an IC package are in common use. Square or rectangular packages such as the Plastic Quad Flat Pack (PQFP) and other package types having a plastic body formed in a rectangle are used in many applications.

Alternative IC packages, such as the PQFP, have leads extending outwardly at all four sidewalls as opposed to just two sidewalls as in the DIP design. The lead ends (as on the PQFP) are often bent to form feet parallel to the top and bottom surfaces and parallel to the PCB on which they are mounted. The pitch, or distance between adjacent leads, on the packages is typically on the order of 0.020–0.025 inches.

The alternative packages and increased lead densities reflect the premium placed on printed circuit board space and the desire to minimize area consumed by electronics. As well, non-packaging mechanical schemes have been devised for minimizing area consumed by electronics while permitting the supplementing, upgrading and/or overriding of existing circuitry mounted on a PCB.

It is known to stack DIP components, as suggested by U.S. Pat. No. 4,406,508 and U.S. Pat. No. 4,696,525. However, such known methodologies do not address problems inherent in stacking components configured in alternative packages. With the small pitch distance between pins on many packages and the presence of pins on all four sides of the packages, significant alignment problems arise. Generally, in order to connect one PQFP device to another it is necessary that there be a one to one connection of pins, for example, pin 1 to pin 1, pin 160 to pin 160, etc. Known devices for stacking DIPs use the lower portions of endwalls to orient the connector. However, with a square or rectangular package with electrical contacts on all sides, there are no endwalls for alignment purposes.

Additional problems arise in known DIP stacking devices because of susceptibility to mechanical loosening. Devices in the top position can become loose either due to thermal expansion or vibration which can lead to reliability and performance problems.

Various other problems arise, relating to electrical continuity and shorting of leads in high pin count DIPs, so that a skilled technician is sometimes needed to install the packages in order to connect or stack two IC packages. Pressure often must be exerted on the packages for seating to be exact, however, pushing too hard or applying too much pressure can either bend the leads so as to cause non-connections and short circuits, and/or decreased reliability.

SUMMARY OF THE INVENTION

The present invention provides a system for aligning and vertically mating closely spaced leads of integrated circuit (IC) packages. The system includes a carrier assembly and mating mechanism that is particularly well adapted to aligning and mating ICs which have large quantities of pins disposed on the perimeter of the package.

According to the invention, a carrier assembly interconnects at least two IC packages having a plurality of leads extending from the package. The carrier assembly includes a dielectric housing for supporting the stacked circuit packages and for aligning the circuit packages for mating. A protective shroud maintains mating and covers the stacked packages so that no damage occurs to the ICs.

The IC package conductive elements are mated by terminals installed in the dielectric housing of the carrier assembly. The terminals include a contact tail for contacting the conductive elements of an upper IC package and a contact beam for contacting the conductive elements of a lower IC package. The contact tail is disposed substantially parallel to an upper surface of the dielectric carrier housing and the contact beam is disposed substantially perpendicular to the upper surface of the carrier housing. Securing the upper IC package in the carrier assembly and placing the carrier assembly over the lower IC package will effectively mate the ICs. The protective shroud has a locking mechanism. Placing the shroud over the carrier assembly and locking or interlocking the shroud with the lower IC package or alternative mating element, keeps the carrier assembly in place and protects the upper IC from damage.

Features of the invention include a socket which is easily aligned with the devices being aligned and mated via the socket. The socket is easily installed and removed by one not possessing a high degree of skill and/or technical knowledge. The socket substantially precludes stacked IC's from being damaged and coming loose due to vibration.

BRIEF DESCRIPTION OF THE DRAWINGS

Other objects, advantages and features of the invention will be apparent from a reading of the following detailed description in conjunction with the accompanying drawings in which.

DESCRIPTION OF ILLUSTRATIVE EMBODIMENT

Figure 1:
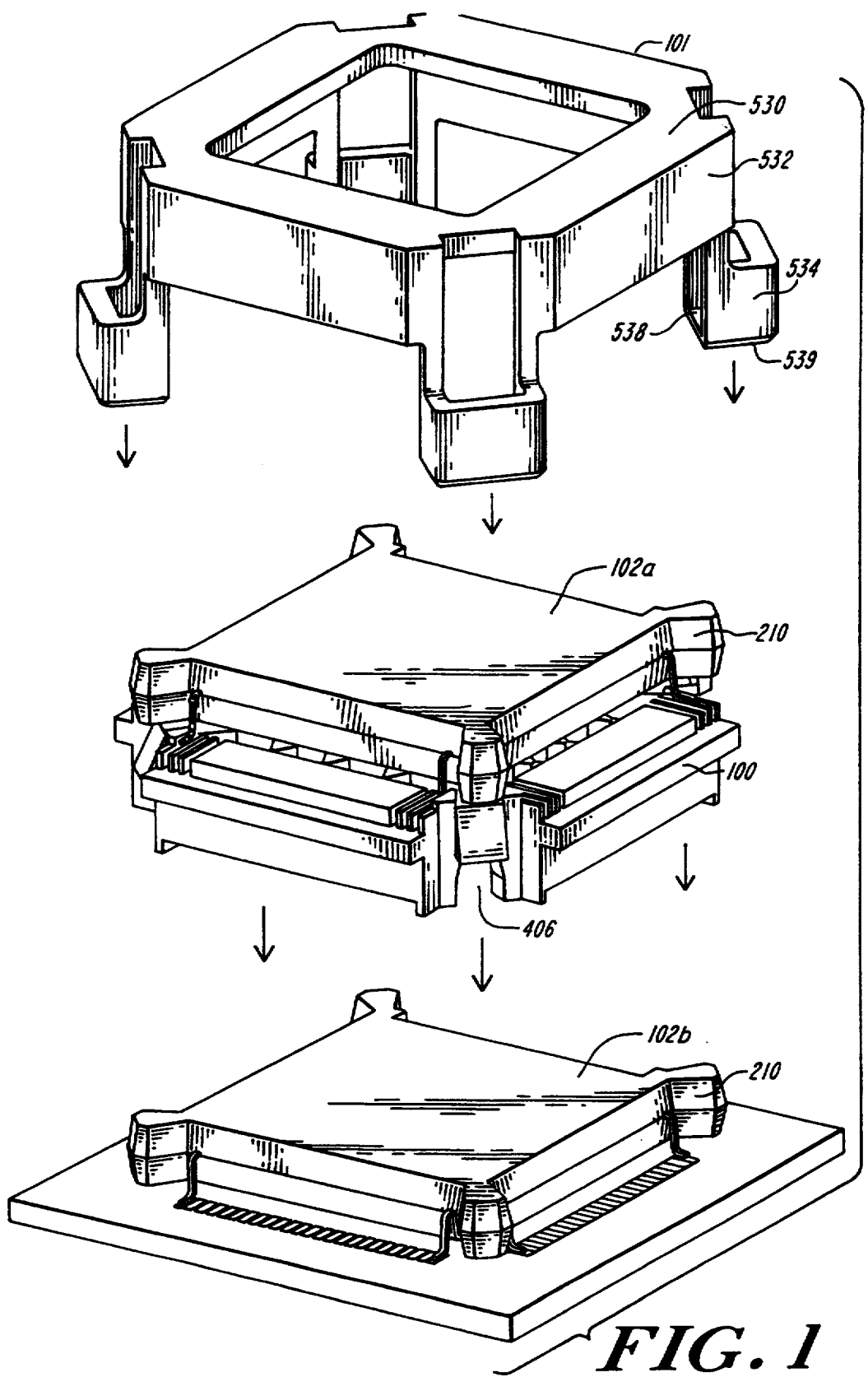
FIG. 1 is an exploded perspective view of an illustrative embodiment of a stackable interconnection socket useful for mating two PQFP packages showing an upper integrated circuit package installed on a dielectric carrier assembly and a lower package installed on a printed circuit board.

Referring to FIG. 1, a stackable socket system is comprised of a carrier assembly 100 and a shroud 101 for interconnecting an upper IC package 102a and a lower IC package 102b. The illustrative embodiment shows interconnection for two ICs, each in a plastic quad flat package (PQFP), however, it will be apparent from the following discussion that the invention is applicable for other IC package types.

Figure 2:
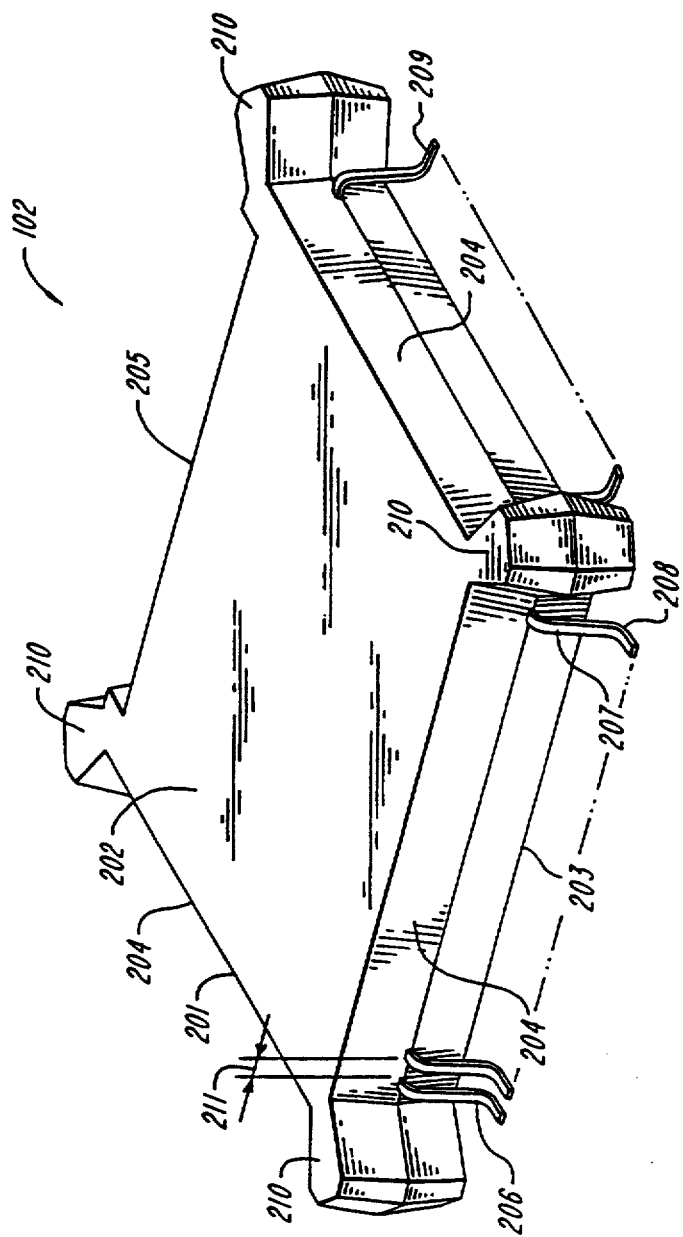
FIG. 2 is a perspective view illustrative of a plastic quad flat package (PQFP)

The illustrative PQFP package 102, shown in FIG. 2, is an integrated circuit package manufactured in accordance with Joint Electron Device Engineering Council (JEDEC) specifications MO-069 REGISTRATION PLASTIC QUAD FLAT PACK (GULLWING) 0.025" LEAD SPACING, which is incorporated herein by reference. Such an illustrative device is typically comprised of a lead frame encapsulated in a plastic body 201. The plastic body 201 encapsulates the IC and comprises a top surface 202, a bottom surface 203, sidewalls 204 and an optional polarity sidewall 205.

The polarity sidewall 205 is used to orient the IC so that it cannot be placed improperly into a specific location. Since the chip is rectangular or square, an indication of the chip's polarity or proper orientation is useful, as improper placement can result in damage to the device or to other components connected to the device. The optional polarity sidewall 205 is shown only for illustrative purposes and is not necessary to practice the invention described hereinafter.

PQFP packages such as illustrated in FIG. 2 typically have a plurality of leads 206 extending from each sidewall 204, 205, with a gap 211 between adjacent leads 206. For clarity, not all leads are shown in FIG. 2. The leads 206 extend from sidewalls 204, 205 and are bent downward having a substantially straight portion 207 adjacent the sidewalls 204, 205. The leads 206 have a second bend 208 forming a "gull wing" portion 209 substantially parallel to the lower surface 203. In addition, the PQFP package, as shown in FIG. 2, has four bumpers 210 to protect the leads 206. The bumpers 210 extend substantially diagonally from the corners of the package 102.

Figure 3:
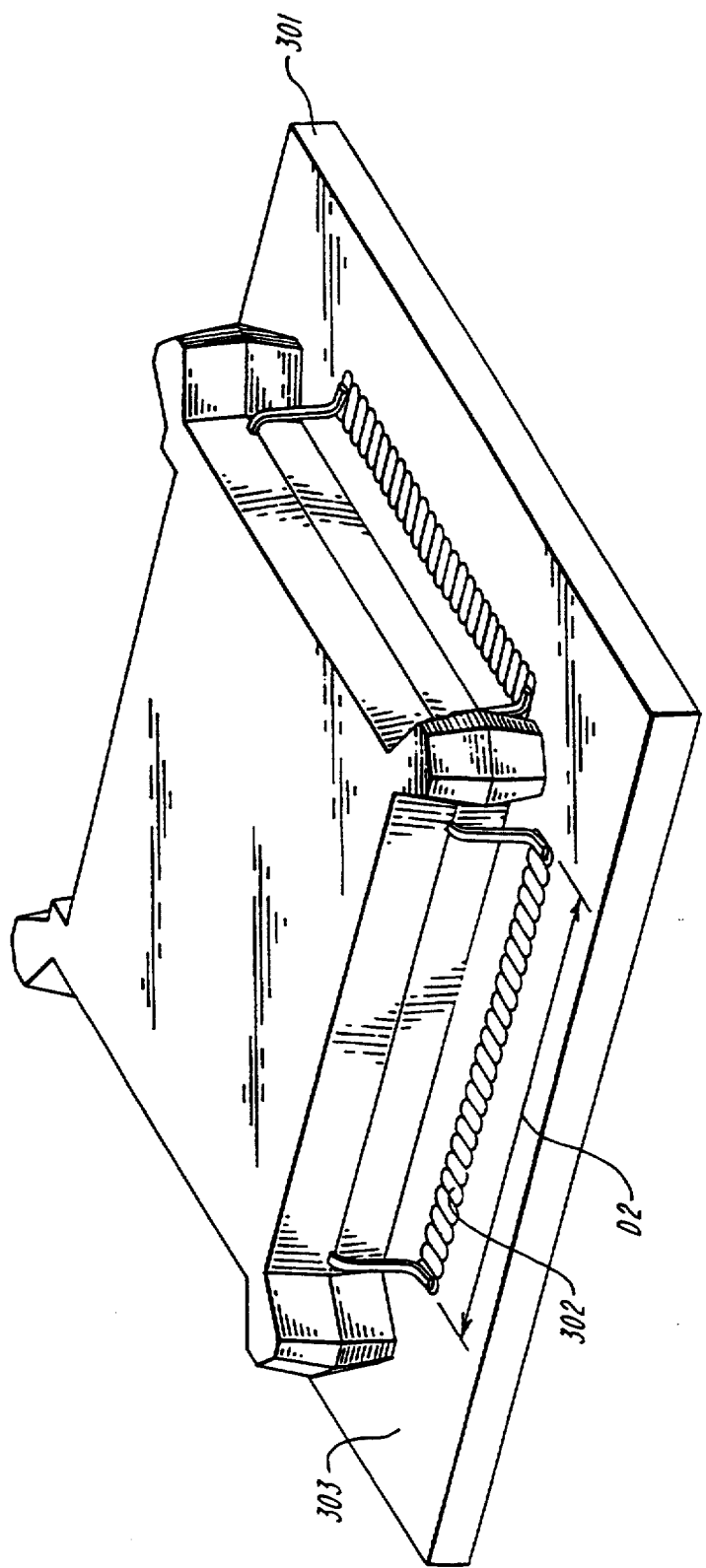
FIG. 3 is a perspective view of the PQFP of FIG. 2 attached to a printed circuit board.

FIG. 3 illustrates the PQFP package 102 mounted on a printed circuit board (PCB) 301. Solder pads 302 disposed on an upper surface 303 of the PCB 301 contact the gull wing portion 209 of the leads 206. This connection is made mechanically and electrically complete by soldering the lead 206 to the solder pad 302 at the area of contact between the gull wing portion 209 and the solder pad 302.

Figure 4:
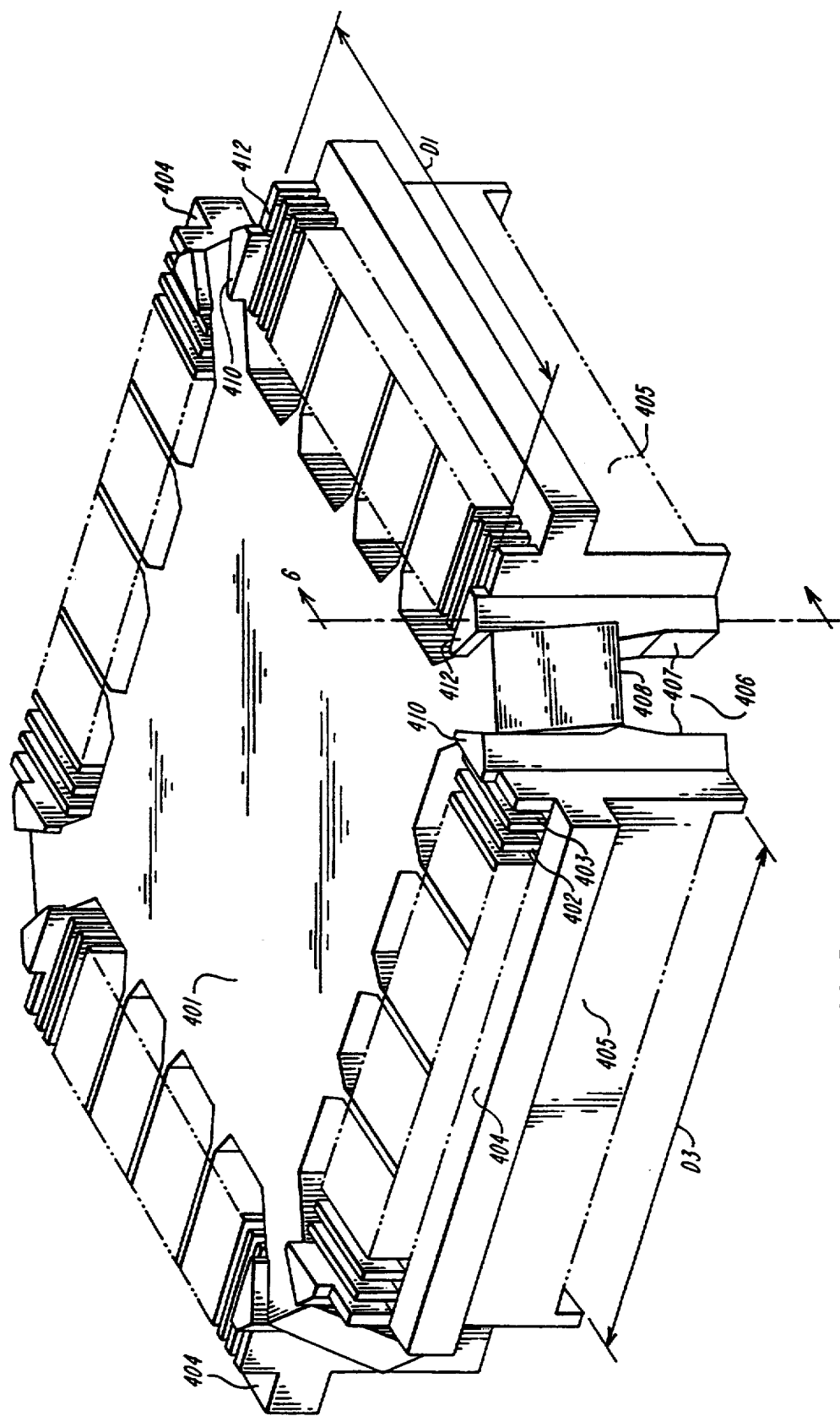
FIG. 4 is a perspective view of the dielectric carrier assembly of FIG. 1.

The carrier assembly 100 for accommodating a PQFP IC is illustrated in FIG. 4. The carrier assembly 100 has a top surface 401 in a similar shape or footprint as the PQFP package 102. A series of lead spacers 402 and adjacent lead positions 403 are disposed along the four outer edges 404 of the top surface 401 of the carrier assembly 100, to accommodate the leads 206 of a PQFP disposed thereon. The lead positions 403 are configured to receive the leads 206 of an upper PQFP 102a (FIG. 1), stacked via the carrier assembly 100 on a lower PQFP. The distance between the centers of adjacent lead positions 403 is the same as the distance between the centers of adjacent leads 206 on the PQFP package. For clarity, not all lead spacers 402 and lead positions 403 are shown.

When the PQFP package 102 is properly placed on the top surface 401 of the carrier assembly 100, there is a one-to-one correspondence between each lead position 403 and each lead 206. A plurality of corner posts 410 on the top surface 401 each having a contact facing surface 412, assure proper alignment of the leads 206 in their respective lead positions 403. At least one pair of opposed contact facing surfaces 412, as illustrated in FIG. 4, defines a distance D1 dimensioned to accommodate a distance D2 (shown in FIG. 3) between the outer edges of the extreme leads 206 on a side of the package, so that each of the leads 206 along a side are aligned within respective lead positions 403 along the sides. In the illustrative embodiment, eight corner posts 410 are implemented, each having a respective contact facing surface 412. One of ordinary skill in the art will appreciate that the top surface 401 can be configured to similarly accommodate any of various IC package shapes by implementing a different configuration of this top surface 401.

The carrier assembly 100 illustrated in FIG. 4 has four lower sidewalls 405, only two of which can be seen in FIG. 4. A plurality of alignment gaps 406, are bounded by end surfaces 407 of adjacent lower sidewalls 405 and a gap roof 408. The illustrative embodiment of the carrier assembly 100 is configured to be placed over a PQFP IC (e.g. the lower IC package 102b), mounted on a PCB. The four alignment gaps 406 provide a mechanism to coarsely fit and align the carrier assembly 100 over the lower PQFP 102b by engagement with the bumpers 210 thereof. During installation of the mating system as described hereinafter, the carrier assembly 100 is coarsely aligned over the lower PQFP 102b in a single orientation, e.g. by way of the polarity sidewall 205 engaging an orientation feature (501, FIG. 5), on the carrier assembly 100, which corresponds to the orientation of the top surface 401, ensuring that a pin corresponding to pin 1 of the carrier assembly 100 is directly above a pin 1 of the lower IC package 102b.

Figure 5:
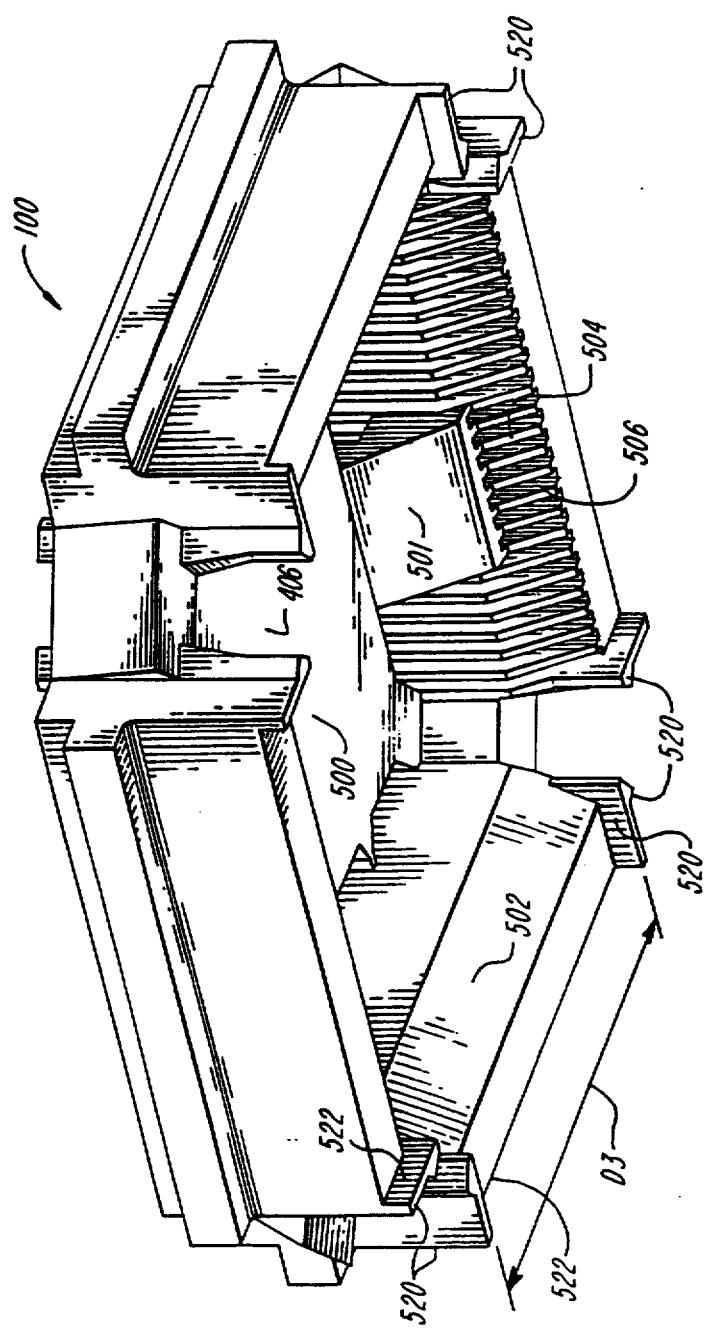
FIG. 5 is a bottom perspective view of the carrier assembly of FIG. 4.

The bottom side of the carrier assembly 100 is illustrated in FIG. 5. An inner area 500 of the carrier assembly 100 is configured to receive the lower PQFP 102b. Oriented perpendicular to four inside sidewalls 502 are inner lead spacers 504 which perform substantially the same function as the lead spacers 402, discussed hereinbefore with respect to the top surface 401. The spacing provided by the inner lead spacers 504 is substantially equal to the spacing between the leads 206 of a PQFP packaged IC which are accommodated by inner lead positions 506. In the illustrative embodiment, the inner lead spacers 504 are substantially aligned with the lead spacers 402 and accommodate respectively the space between the leads 206 on the lower and upper PQFP's. The inner lead positions 506 are substantially aligned with the lead positions 403 on the top surface 401 and accommodate respectively the leads 206 on the lower and upper PQFP's.

When the carrier assembly 100 is placed over the lower IC package 102b the alignment gaps 406, in conjunction with the bumpers 210 of the lower PQFP 102b, serve to coarsely align the carrier assembly 100 on the lower IC package 102b, as discussed hereinbefore. Additional features of the bottom side of the carrier assembly, best seen in FIG. 5, serve to provide more exacting, or fine alignment, between the lower PQFP 102b and the carrier assembly 100 disposed thereon. A plurality of lower alignment features 520 include interior alignment surfaces 522. At least one pair of opposed interior alignment surfaces 522 defines a distance D3, dimensioned substantially similarly to the top surface 401 contact facing surfaces 412, to accommodate a distance D2 (shown in FIG. 3) between the outer edges of the extreme leads 206 on a side of the lower PQFP package 102b, so that each of the leads 206 along a side are aligned within respective inner lead positions 506 along the side.

Figure 6:
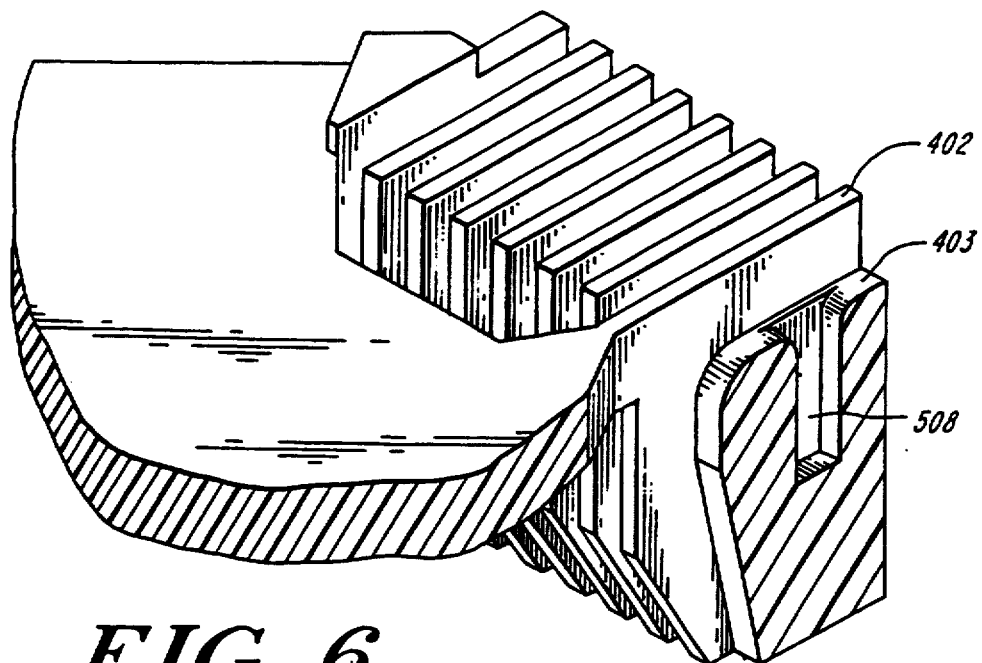
FIG. 6 is a perspective view partially in section of the carrier assembly taken through line 6—6 of FIG. 4.
Figure 7:
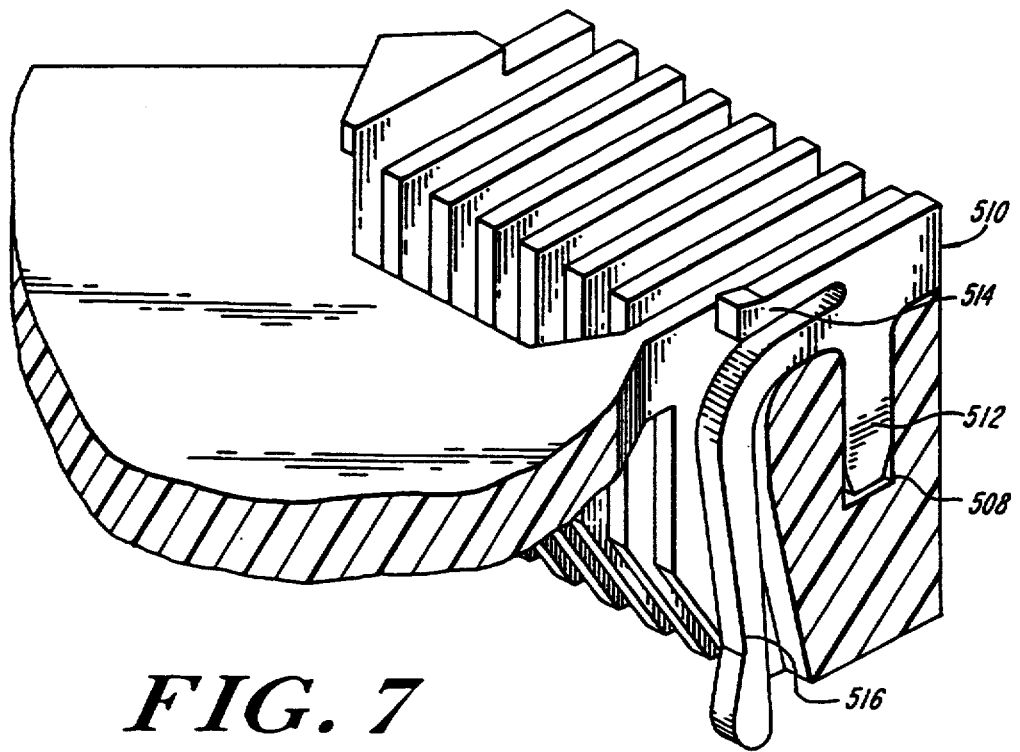
FIG. 7 is the carrier assembly of FIG. 6 having a terminal installed therein.

Referring now to FIGS. 6 and 7, the lead positions 403 on the top surface 401 separated by the lead spacers 402, have a terminal well 508 disposed therein. As illustrated in FIG. 7, a terminal 510 for contacting the gull wing portion 209 of respective leads 206 (of both upper and lower PQFP's) is installed in the terminal well 508. The terminal 510 is made with an electrically conductive material and consists of three appendages: a contact post 512, a contact tail 514 and a contact beam 516. The contact post 512 is inserted in the terminal well 508 and maintains the contact within the terminal well 508, such as by a friction fit. The contact tail 514 is oriented in a plane substantially parallel to the top surface 401 and is configured to contact a lead of the upper PQFP 102a. The contact beam 516 is oriented substantially perpendicular to the plane of the top surface 401 and is configured to contact a lead of the lower PQFP 102b.

A single orientation is indicated for aligning the lower PQFP 102b and the carrier assembly 100, such as by the polarity side wall 205, markings or other orientation mechanisms known in the art. When the carrier assembly 100 is positioned onto the lower PQFP 102b, as described hereinafter, the dielectric material of the carrier assembly 100 engages the bumpers 210 at the alignment gaps 406 to coarsely align the lower PQFP 102b and the carrier assembly 100. The lower alignment feature's 520 interior alignment surfaces 522 engage the sides of the extreme leads 206 positioning the contact beam 516 of the terminal 510 appropriately with respect to the leads 206 of the lower PQFP 102b. The carrier assembly 100 and the lower PQFP 102b, thus, are effectively aligned. Suitable electrical engagement between the terminals 510 and the leads 206 follows, as described hereinafter, when pressure is applied to engage the protective shroud 101 (FIG. 1) with the lower PQFP 102b for stacking the packages on the printed circuit board.

Figure 8:
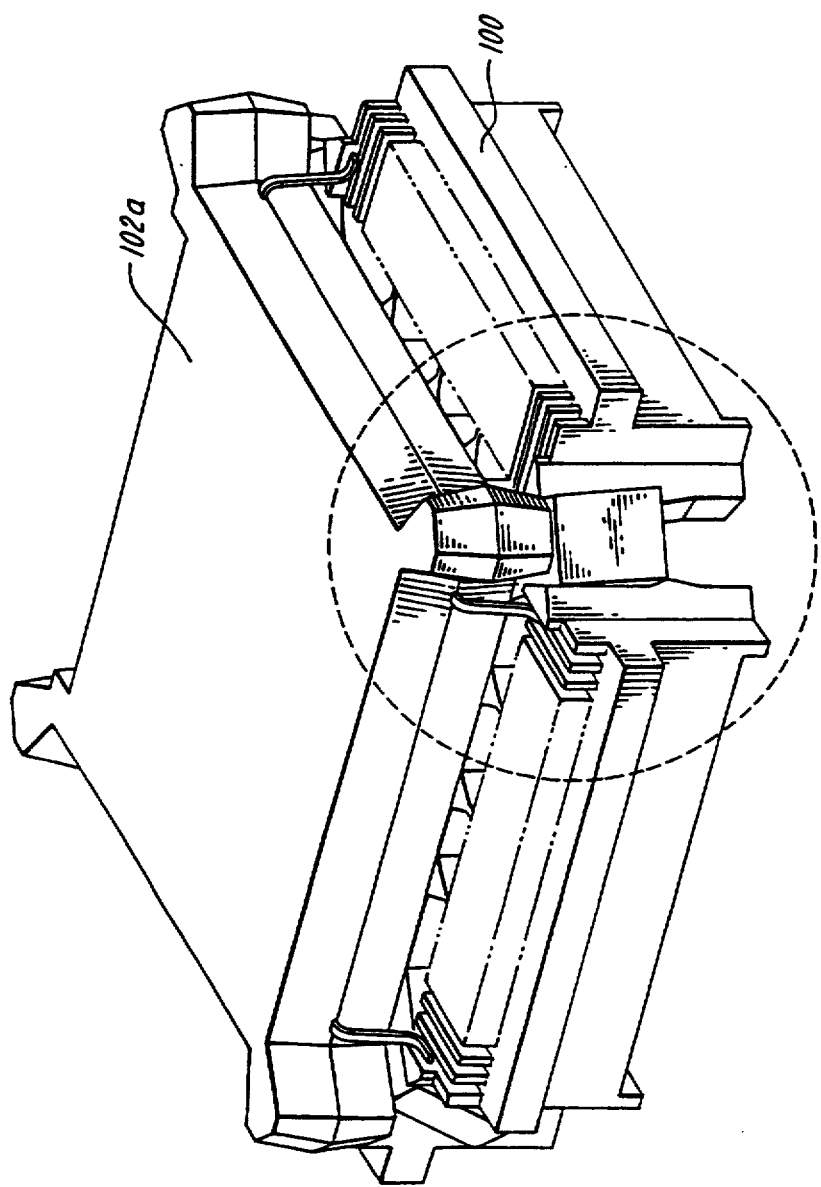
FIG. 8 is a perspective view of the PQFP of FIG. 2 mounted on the carrier assembly of FIG. 4.
Figure 9:
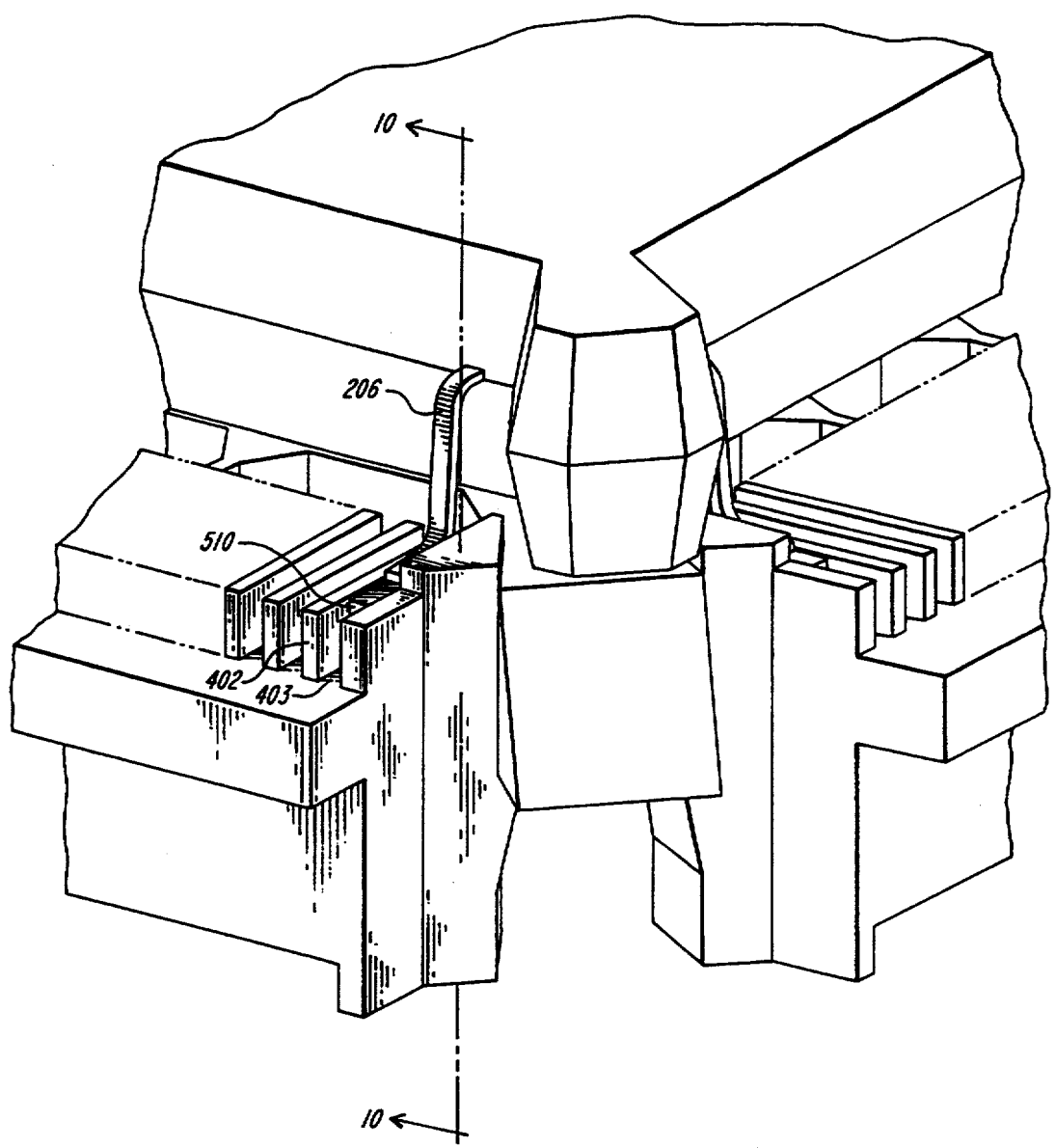
FIG. 9 is a magnified perspective view of the area circled in FIG. 8.
Figure 10:
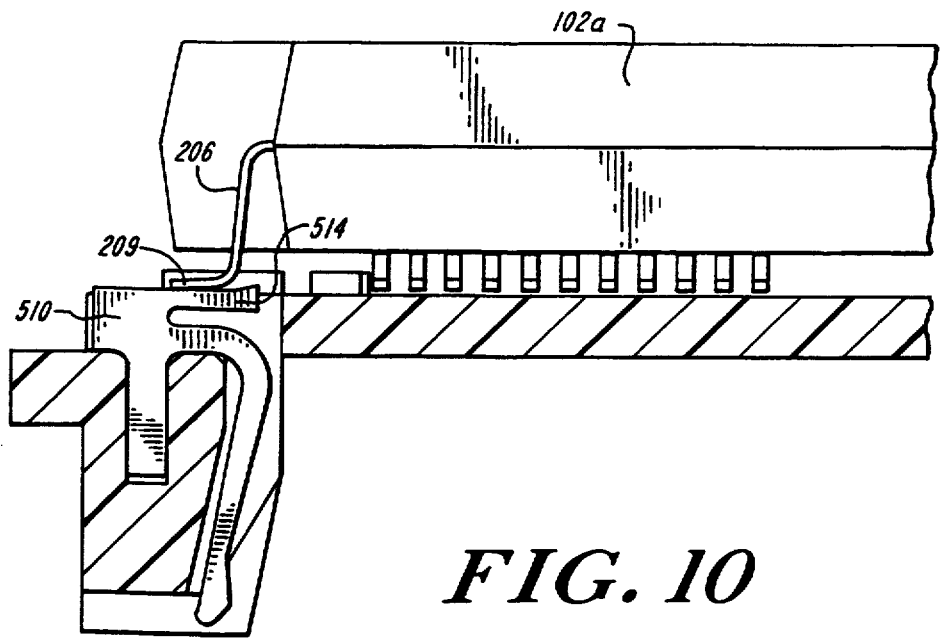
FIG. 10 is a side sectional view taken through line 10—10 of FIG. 9.

FIGS. 8–10 illustrate the upper PQFP 102a mounted on a carrier assembly 100 and the relation of the leads 206 to the terminals 510, lead positions 403 and lead spacers 402. Each lead 206 is mechanically and electrically connected to a corresponding terminal 510 by soldering the gull wing portion 209 to the contact tail 514 where the gull wing portion 209 and contact tail 514 meet.

Figure 11A:
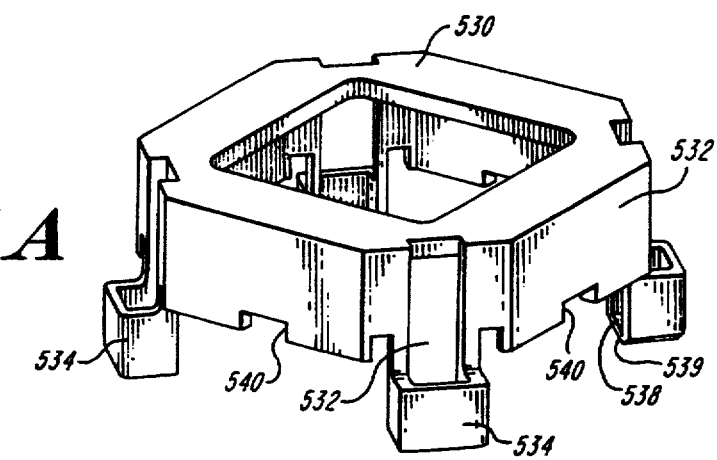
FIG. 11A is a perspective view of a protective shroud.
Figure 11B:
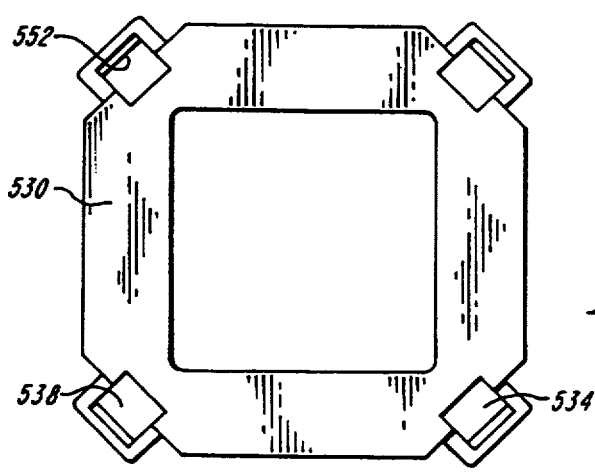
FIG. 11B is a top view of the protective shroud of FIG. 11A.

The protective shroud 101, illustrated in FIGS. 11A and 11B, is preferably made of a dielectric material and configured to engage the carrier assembly 100 having the upper PQFP 102a disposed thereon. The shroud 101 has a shroud upper surface 530 and shroud sidewalls 532. The protective shroud 101 of the illustrative embodiment is substantially similar in shape and slightly larger in dimension than the package, e.g. PQFP. The shape of the protective shroud 101 is determined by the geometry of the IC packages which are being aligned and mated.

In the illustrative embodiment, four resilient latches 534 are oriented substantially perpendicular to the plane of the shroud upper surface 530. Each latch 534 has a latch floor 538, configured to engage an underside portion of the bumpers 210 (FIG. 2) of the PQFP's. A floor abutment surface 539 is effectively an edge of the latch floor 538 against which portions of components of the system abut to deflect the resilient latches during assembly and disassembly of the system as described hereinafter. The shroud sidewalls 532 each have a catch recess 540 disposed thereon.

Figure 12A:
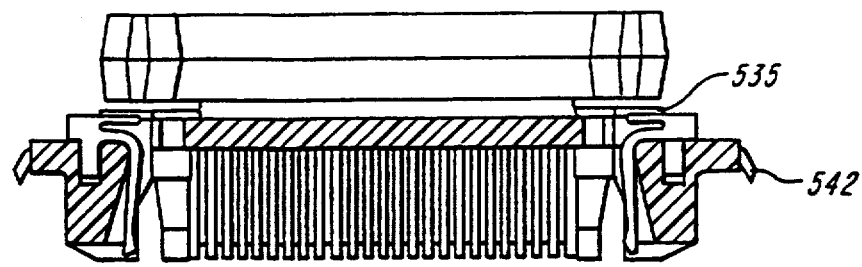
FIG. 12A is a side view partially in section of the PQFP mounted on the carrier assembly.
Figure 12B:
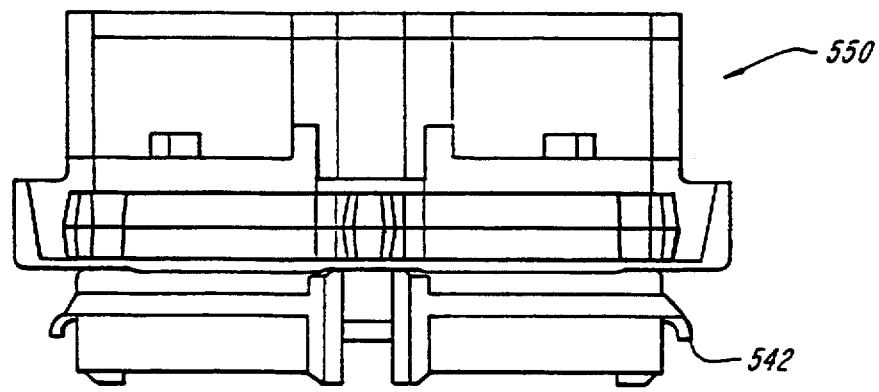
FIG. 12B is a side view of the PQFP mounted on the carrier assembly having the shroud disposed thereover.

The protective shroud 101 is preferably disposed over the carrier assembly 100 having the upper PQFP 102a soldered thereon. As the shroud 101 is pressed onto the upper PQFP 102a and carrier assembly 100, pressure exerted against the shroud floor abutment surfaces 539 by a portion of the bumpers 210 of the upper PQFP 102a deflects the latches 534 outwardly. When the floor abutment surfaces 539 exceed a lower portion of the bumper, the latches 534 deflect inwardly and the shroud latch floors 538 engage the upper PQFP 102a bumpers at a spacing 535, best seen in FIGS. 12A, and 12B beneath the bumpers of the upper PQFP 102a soldered to the carrier assembly 100. The shroud/upper PQFP/carrier assembly combined, form a pre-engaged assembly 550, as illustrated in FIG. 12B.

The shroud 101 is configured with sufficient space so that the pre-engaged assembly 550 can be mated with the lower PQFP 102b mounted to the PCB. The pre-engaged assembly, properly oriented for correspondence between respective pins of the upper and lower PQFP's, is pressed downwardly at the shroud upper surface 530. Each latch 534 deflects outwardly during the downward pressure.

Figure 12C:
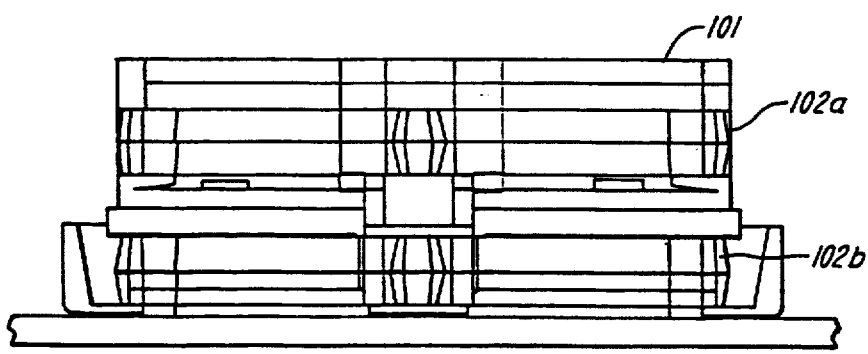
FIG. 12C is a side view of the PQFP mounted on the carrier assembly further attached via the shroud, on a PQFP which is mounted on a PCB.

The shroud floor abutment surfaces 539 travel along outer portions of the carrier assembly 100, which includes corner protuberances 542, that assure that the abutment surfaces 539 do not get stuck at the junction of the carrier assembly 100 and the lower PQFP 102b. Continuous downward pressure actuates the latches 534 further downward over portions of the bumpers of the lower PQFP 102b, until the abutment surfaces 539 exceed a lower portion thereof. The latches 534 deflect inwardly so that the latch floor 538 engages the underside of the lower IC package 120b at the bumper portion 210. A tactile response issues upon engagement to confirm: the proper seating of the latch 534; that the respective leads 206 of the upper PQFP 102a and the lower PQFP 102b are properly electrically and mechanically engaged via the carrier assembly 100 seating; and that mating or stacking is complete, as shown in FIG. 12C.

In order to facilitate removal of the protective shroud 101, upper PQFP 102a, and carrier assembly 100 from the lower IC package 102b, extraction tool openings 552 (best seen in FIGS. 11A and 11B), are provided in the shroud 101 for receipt of an extraction tool.

Figure 13A:
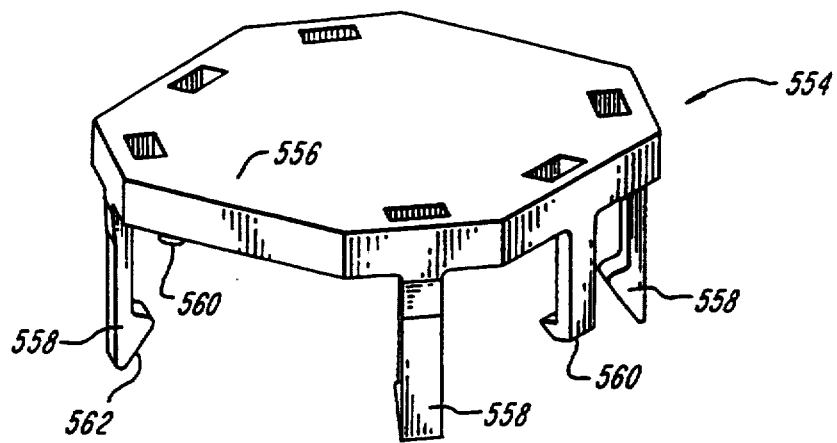
FIG. 13A is a perspective view of an extraction tool.
Figure 13B:
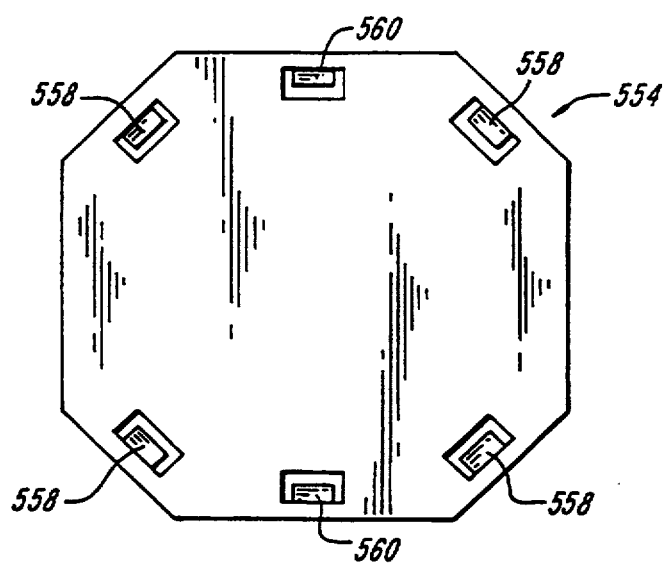
FIG. 13B is a top view of the extraction tool of FIG. 13A.

The extraction tool 554, referring now to FIGS. 13A and 13B, comprises a substantially planar top 556 and a plurality of legs extending therefrom. The legs include four extraction legs 558 at corners of the tool, which align with the extraction tool openings 552 in the protective shroud 101. The legs also include an opposed pair of catch legs 560 disposed opposite to each other, which each align with a respective catch recess 540 on the sidewalls 532 of the protective shroud 101.

Figure 14:
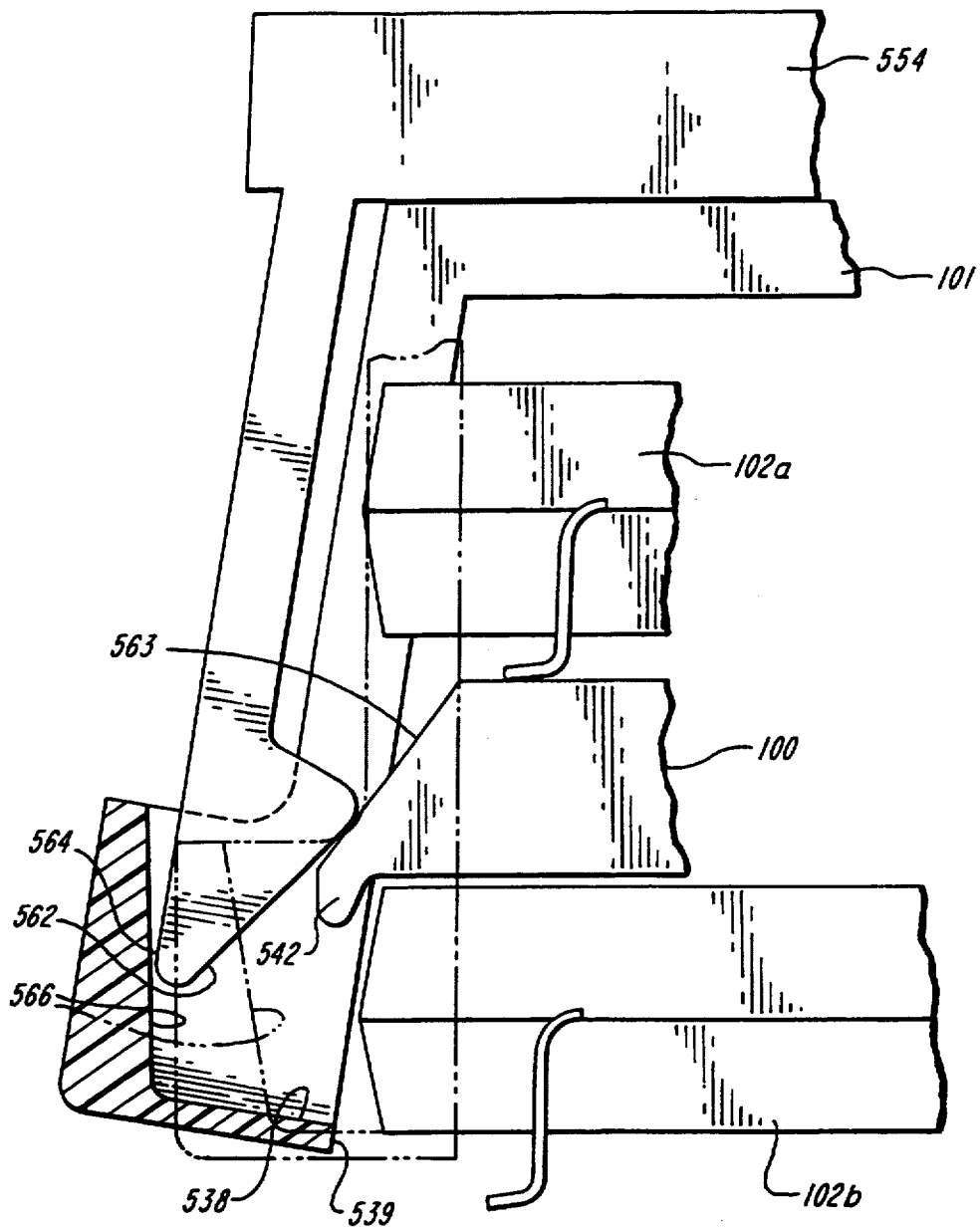
FIG. 14 is a side view partially in phantom, of the extraction tool disengaging the shroud from securely stacked elements.

The extraction tool 554 is aligned above the protective shroud 101 of the securely stacked elements, with the extraction legs 558 and the catch legs 560 appropriately aligned with the extraction tool openings 552 and catch recesses 540, respectively. The extraction legs 558 are inserted into the tool openings 552 of the shroud 101. As the extraction legs 558 are actuated downwardly via pressure applied to the top 556, inclined surfaces 562 on the legs 558 slidably contact the bumper of the upper PQFP 102a and then an outer ramp surface 563 of the carrier assembly 100 having the corner protuberance 542, as illustrated in FIG. 14.

An outer surface 564 of the extraction legs 558 engages an interior surface 566 of the latch 534 and deflects the latches 534 outward as the extraction legs 558 descend down the outer ramp surfaces 563 of the carrier assembly 100. Downward pressure is applied to the top of the extraction tool 554 until the extraction tool descends to a point whereat the catch legs 560 of the extraction tool engage the catch recesses 540 on the shroud 101. At this point the latches 534 have been deflected outward to the extent that the abutment surface 539 of the latches 534 clears the bumpers 210 of the lower PQFP 102b. The opposed catch legs 560 effectively grasp the shroud 101 via the catch recesses 540. The shroud 101 is then lifted upwardly relative to the stacked elements via the extraction tool 554, freeing the shroud 101 from the lower PQFP 102b whereupon the carrier assembly 100 and upper PQFP 102a soldered thereto, are accessible and removable. The shroud latch floor 538 may engage a bottom portion of the protuberance 542 so that the extraction tool 554 removes the carrier assembly 100 having the upper PQFP 102a disposed thereon.

Figure 15:
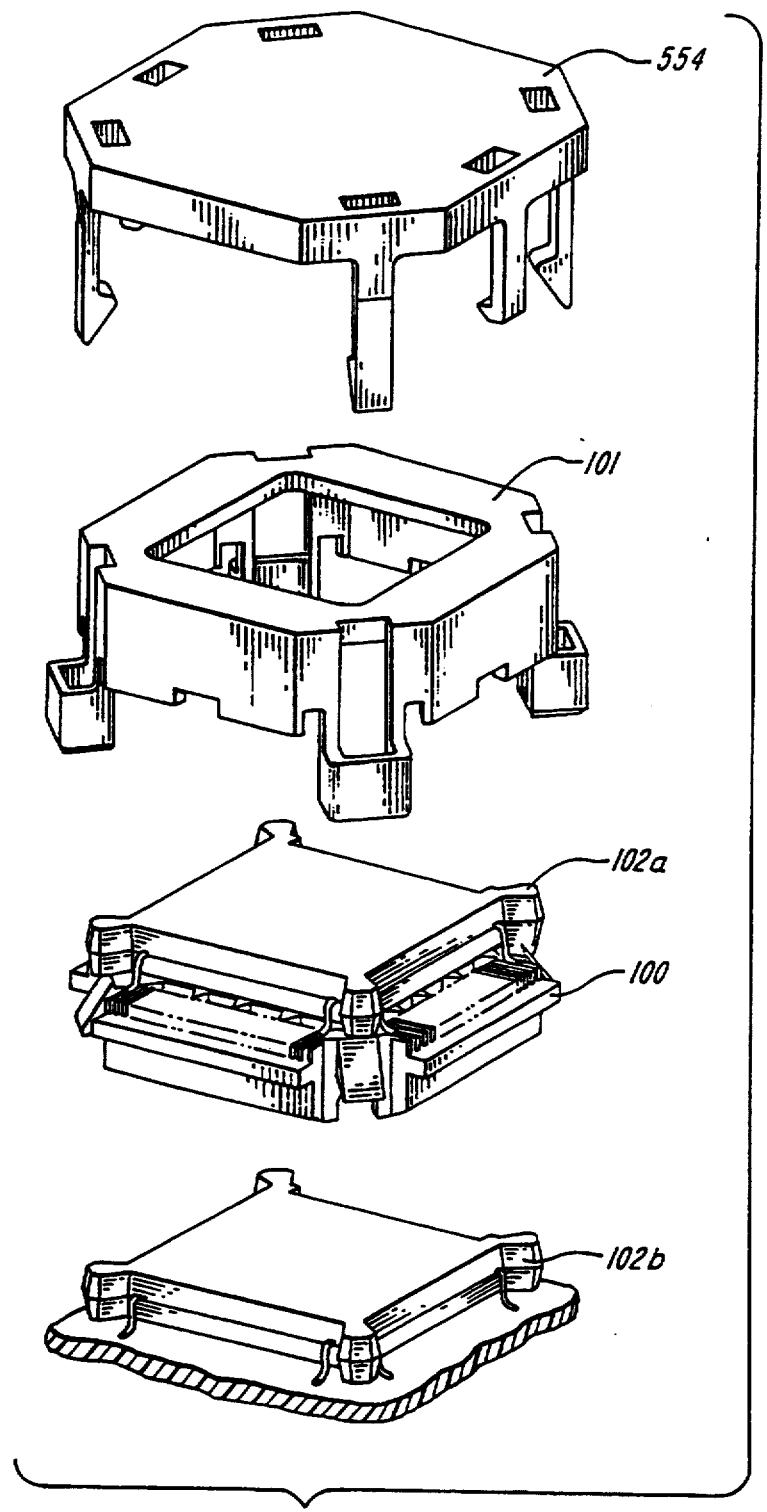
FIG. 15 is an exploded view of a disassembled illustrative embodiment of a component interconnection and mating system.

The extraction tool 554 can then be disengaged from the shroud 101 by deflecting the catch legs 560 out of engagement with the catch recesses 540, effectively separating the stacked elements of the system, as illustrated in FIG. 15.

It should be appreciated that the IC package mounted on the PCB, i.e. the lower package, does not necessarily have to have bumpers integrated into the package. The bumpers, or other engagement feature, may be placed separately into the PCB to effect the same purpose, so that the carrier assembly 100 can be aligned as discussed hereinbefore.

Figure 16A:
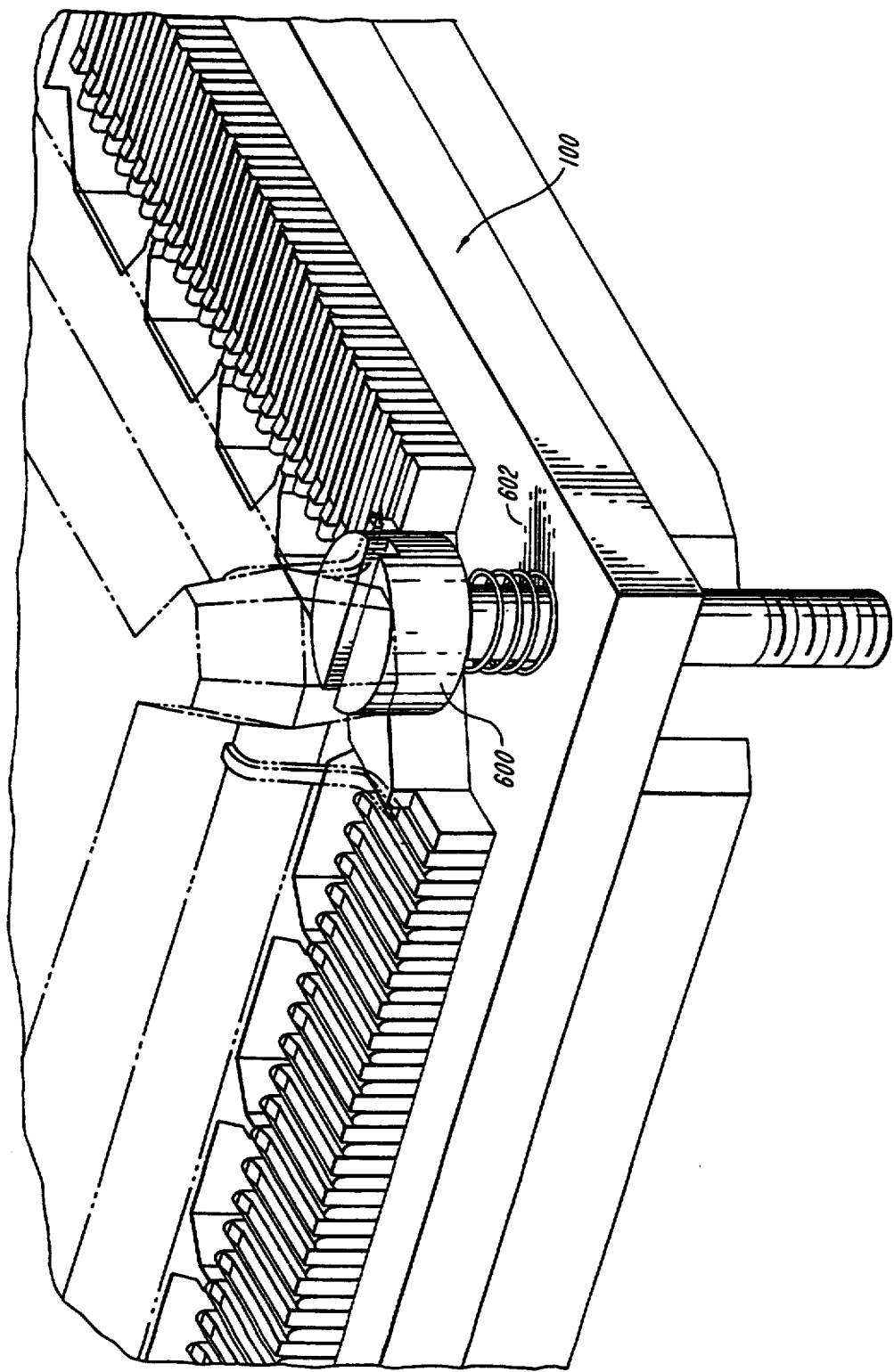
FIG. 16A is a perspective view of an alternative engagement mechanism.

Further, while a shroud 101 is discussed hereinbefore, it will be appreciated that alternatives thereto can be implemented. As illustrated in FIG. 16A, the upper package 102a connected to the carrier 100 can be mated with the lower package 102b by means of a screw 600 through an extension 602 on the carrier assembly. The screw 600 is configured to engage with the printed circuit board or an engagement feature thereon.

Figure 16B:
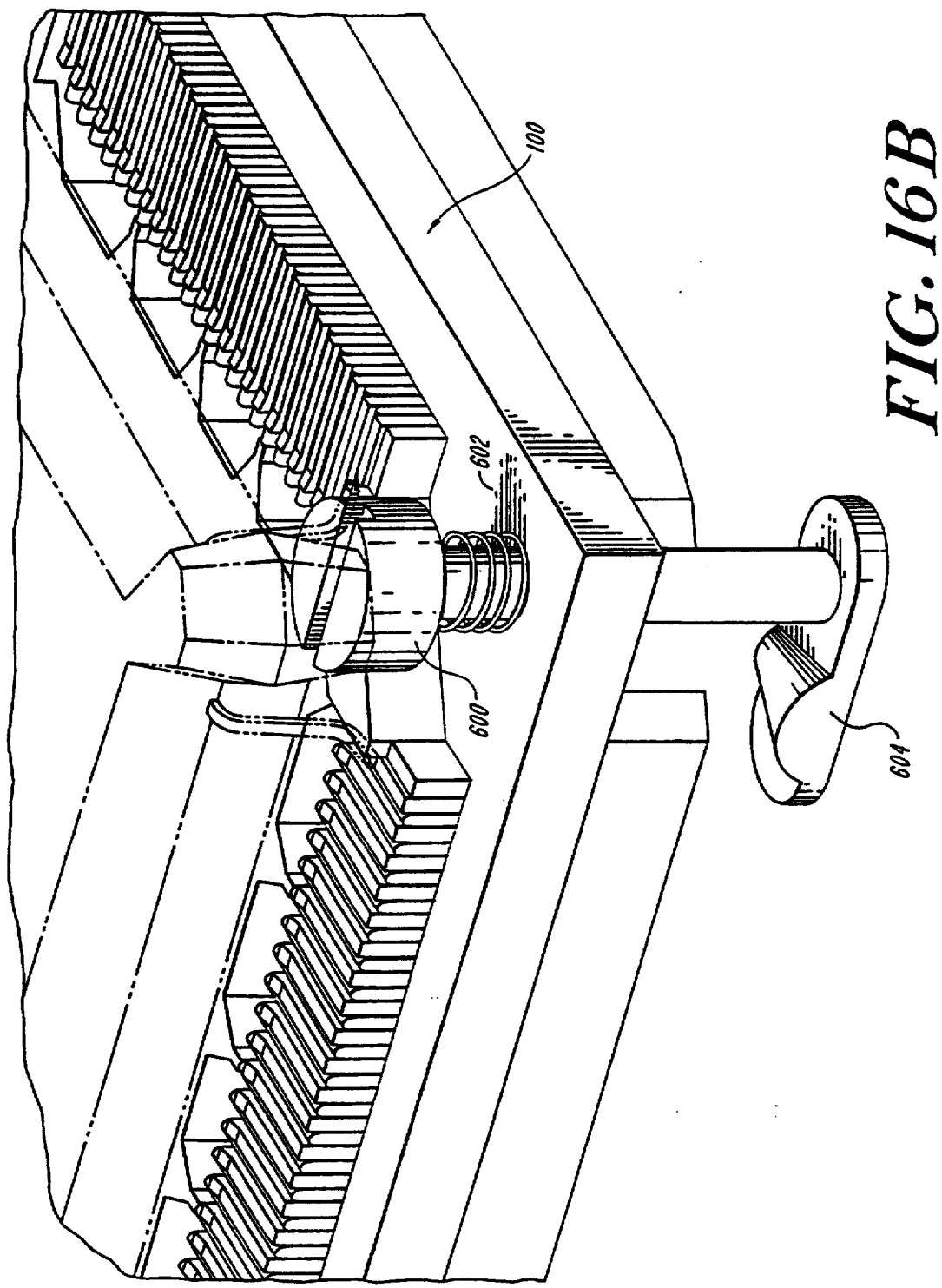
FIG. 16B is a perspective view of another alternative engagement mechanism.

As illustrated in FIG. 16B the screw/extension 602 on the carrier assembly 100 can be configured with a blade 604 fixed to a screw 600, such as a quarter-turn screw. The blade 604, upon turning of the screw 600, engages a lower portion of the PQFP, bumpers, a blade engagement member attached to the package, or the PCB, or the like.

It will also be appreciated by one of ordinary skill in the art that the upper IC package 102a may be attached to the carrier assembly 100 after the carrier assembly 100 has been placed over the lower IC package 102b, and the shroud or alternative attachment mechanism engaged thereafter.

From the previous discussion, it will be apparent to one skilled in the art that latches, such as like latches 534 of shroud 101, could be fashioned as integral parts of the carrier assembly 100 and thereby not use the protective shroud 101 for attachment per se of the carrier assembly 100.

Additionally, as mentioned above, the components which the latches attach under do not have to be part of the lower IC package. Any appropriately positioned and appropriately shaped component could be used equivalently.

Although alignment and mating of two PQFP packages is disclosed hereinbefore, it will be appreciated that the invention can be implemented for aligning and mating packages of various types, similar and dissimilar types, such as a DIP mated to a PQFP, leadless chip carriers such as PLCC's to PQFP's or the like.

Similarly, it will be appreciated that pin for pin mating may not be desirable in certain applications of the invention and that it may be desirable to align and mate a portion or subset of an array of available pins or interconnections.

Further, while a polarity sidewall 205 is disclosed in the context of a PQFP device, it will be appreciated that other means of orientation can be implemented, such as keys and keyways, markings or the like, and such can be implemented for alignment and mating of package types other than PQFP.

While it should be appreciated that the invention is applicable for package types other than PQFP, it should be further appreciated that the invention can be implemented to interconnect numbers of packages in excess of two.

Although the invention has been shown and described with respect to exemplary embodiments thereof, various other changes, omissions and additions in form and detail thereof may be made therein without departing from the spirit and scope of the invention.

What is claimed is:

1. A socket for interconnecting a lower IC package and an upper IC package, said upper IC package having a plurality of upper package leads and said lower IC package having a plurality of lower package leads and an alignment corner, wherein said lower IC package is attached to a substrate by said plurality of lower package leads, said socket comprising:
    a carrier having an upper surface, a lower surface, and at least one alignment gap engagable with said alignment corner to coarsely align said carrier with said lower IC package, said lower surface configured for receiving said lower IC package, said lower surface including lower lead positions defined by a plurality of lower surface lower package lead fine alignment surfaces, said upper surface configured for receiving said upper IC package and having upper lead positions defined by a plurality of upper surface upper package lead fine alignment surfaces; and
    a plurality of electrically conducive terminals electrically connecting respective ones of said plurality of upper package leads and said plurality of lower package leads positioned in respective ones of said upper lead positions and said lower lead positions.

2. The socket of claim 1 wherein each of said electrically conductive terminals includes a contact post configured to secure said electrically conductive terminals to said carrier, and a contact beam and a contact tail, one of said contact beam and said contact tail configured for electrical connection with a respective one of said upper package leads and said lower package leads and the other of said contact beam and said contact tail configured for electrical connection with a respective one of the other of said upper package leads and said lower package leads.

3. The socket of claim 1 wherein at least one of said upper surface upper package lead fine alignment surfaces and said lower surface lower package lead fine alignment surfaces comprise interior alignment surfaces projecting outwardly from said carrier and assuring that respective ones of said upper package leads and said lower package leads are properly aligned with respective ones of said upper lead positions and said lower lead positions, respectively.

4. The socket of claim 1 wherein at least one of said upper surface upper package lead fine alignment surfaces and said lower surface lower package lead fine alignment surfaces comprises at least one pair of opposed contact alignment surfaces separated by a first distance which is approximately equal to a second distance between outer edges of extreme leads of one of said plurality of upper package leads and said plurality of lower package leads.

5. The socket of claim 1 wherein said lower IC package is a PQFP package having a bumper and said carrier further includes at least one alignment gap engagable with said bumper to coarsely align said carrier with said lower IC package.

6. A socket system for interconnecting a plurality of packages, including a lower package and an upper package, said upper package having at least one upper package electrical contact attached thereto and said lower package having at least one lower package electrical contact attached thereto, said lower package being attached to a substrate and having at least one protective engagement member, said system comprising:
    a carrier assembly having at least one alignment gap to align said carrier assembly to at least one of said upper package and said lower package, said carrier assembly having a first side and a second side and receiving one of said upper package and said lower package on said first side thereof and receiving the other of said upper package and said lower package on said second side thereof, said carrier assembly effecting electrical continuity between said at least one upper package electrical contact and said at least one lower package electrical contact; and
    at least one attachment mechanism, said at least one attachment mechanism engageable with said protective engagement member and maintaining electrical continuity between said at least one upper package electrical contact and said at least one lower package electrical contact.

7. The socket of claim 6 wherein said carrier assembly further comprises lead spacers and lead positions disposed between said lead spacers on one of said first side and said second side and inner lead spacers and inner lead positions disposed between said inner lead spaces on the other of said first side and said second side.

8. The socket of claim 6 wherein said carrier assembly further includes at least one electrically conductive terminal having a contact post configured for insertion within a receptacle in said carrier assembly, said at least one electrically conductive terminal further including a contact tail configured for electrical engagement with one of said at least one lower package electrical contact and said at least one upper package electrical contact, and a contact beam configured for electrical engagement with the other of said at least one lower package electrical contact and said at least one upper package electrical contact.

* * * * *

UNITED STATES PATENT AND TRADEMARK OFFICE
CERTIFICATE OF CORRECTION

PATENT NO. : 5,429,511
DATED : July 4, 1995
INVENTOR(S) : Stephen D. DelPrete et al.

It is certified that error appears in the above-indentified patent and that said Letters Patent is hereby corrected as shown below:

Column 7, line 30, "IC package 120b" should read --IC package 102b--.

Signed and Sealed this

Second Day of April, 1996

Attest:

BRUCE LEHMAN

*Attesting Officer*  *Commissioner of Patents and Trademarks*